(12) United States Patent
Niimi et al.

(10) Patent No.: US 11,940,736 B2
(45) Date of Patent: Mar. 26, 2024

(54) TIN TRAP DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Gota Niimi, Oyama (JP); Yoshifumi Ueno, Oyama (JP); Shinji Nagai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 407 days.

(21) Appl. No.: 17/398,054

(22) Filed: Aug. 10, 2021

(65) Prior Publication Data

US 2021/0364928 A1 Nov. 25, 2021

Related U.S. Application Data

(63) Continuation of application No. PCT/JP2019/009521, filed on Mar. 8, 2019.

(51) Int. Cl.
*G03F 7/00* (2006.01)
*H05G 2/00* (2006.01)

(52) U.S. Cl.
CPC ...... *G03F 7/70033* (2013.01); *G03F 7/70916* (2013.01); *H05G 2/006* (2013.01)

(58) Field of Classification Search
CPC .... G03F 7/70033; G03F 7/20; G03F 7/70916; H05G 2/006; H05G 2/008; H05G 2/005; H01J 35/00
USPC ...................................................... 250/504 R
See application file for complete search history.

(56) References Cited

U.S. PATENT DOCUMENTS

| | | |
|---|---|---|
| 2007/0018119 A1 | 1/2007 | Yabuta et al. |
| 2010/0213395 A1 | 8/2010 | Ueno et al. |
| 2010/0243922 A1 | 9/2010 | Asayama et al. |
| 2011/0101863 A1* | 5/2011 | Komori .................. H05G 2/005 315/111.41 |
| 2011/0226745 A1 | 9/2011 | Nagai et al. |
| 2011/0253913 A1 | 10/2011 | Nagai et al. |
| 2012/0097869 A1 | 4/2012 | Ueno et al. |

(Continued)

FOREIGN PATENT DOCUMENTS

| | | |
|---|---|---|
| JP | 2008-277481 A | 11/2008 |
| JP | 2010-171405 A | 8/2010 |

(Continued)

OTHER PUBLICATIONS

International Search Report issued in PCT/JP2019/009521; dated May 14, 2019.

(Continued)

*Primary Examiner* — Kiet T Nguyen
(74) *Attorney, Agent, or Firm* — Studebaker & Brackett PC (57) ABSTRACT

A tin trap device for collecting tin in a chamber device which causes tin to be turned into plasma with laser light in an internal space thereof may include a housing provided with a gas inlet port through which exhaust gas in the chamber device flows and a gas exhaust port through which the exhaust gas is exhausted; and a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

20 Claims, 8 Drawing Sheets

(56) References Cited

U.S. PATENT DOCUMENTS

| | | |
|---|---|---|
| 2012/0176036 A1 | 7/2012 | Asayama et al. |
| 2012/0182536 A1 | 7/2012 | Loopstra et al. |
| 2012/0223257 A1 | 9/2012 | Nagai et al. |
| 2012/0248343 A1 | 10/2012 | Nagai et al. |
| 2013/0134326 A1 | 5/2013 | Yabu et al. |
| 2014/0008554 A1 | 1/2014 | Asayama et al. |
| 2015/0008345 A1 | 1/2015 | Nagai et al. |
| 2017/0055336 A1 | 2/2017 | Nagai et al. |
| 2017/0064800 A1 | 3/2017 | Nagai et al. |
| 2018/0160518 A1 | 6/2018 | Shiraishi et al. |
| 2018/0173117 A1 | 6/2018 | Chien et al. |
| 2022/0141945 A1* | 5/2022 | Niimi .................. H05G 2/005 355/67 |

FOREIGN PATENT DOCUMENTS

| | | |
|---|---|---|
| JP | 2010-212674 A | 9/2010 |
| JP | 2012-146613 A | 8/2012 |
| JP | 2013-004369 A | 1/2013 |
| JP | 2013-506280 A | 2/2013 |
| JP | 2013-131483 A | 7/2013 |
| WO | 2017-042915 A1 | 3/2017 |

OTHER PUBLICATIONS

Written Opinion issued in PCT/JP2019/009521; dated May 14, 2019.

An Office Action mailed by the Japanese Patent Office dated Mar. 28, 2023, which corresponds to Japanese Patent Application No. 2021-504630 and is related to U.S. Appl. No. 17/398,054; with English language translation.

* cited by examiner

TIN TRAP DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application is a continuation application of International Application No. PCT/JP2019/009521, filed on Mar. 8, 2019, the entire contents of which are hereby incorporated by reference.

BACKGROUND

1. Technical Field

The present disclosure relates to a tin trap device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 20 nm or less will be required. Therefore, it is expected to develop an exposure apparatus that combines an apparatus for generating extreme ultraviolet (EUV) light having a wavelength of about 13 nm with a reduced projection reflection optical system.

As an extreme ultraviolet light generation apparatus, three types of apparatuses have been proposed: a laser produced plasma (LPP) type apparatus using plasma generated by irradiating a target substance with laser light, a discharge produced plasma (DPP) type apparatus using plasma generated by discharge, and a synchrotron radiation (SR) type apparatus using synchrotron radiation light.

LIST OF DOCUMENTS

Patent Documents

Patent Document 1: US Patent Application Publication No. 2011/0226745
Patent Document 2: US Patent Application Publication No. 2007/0018119
Patent Document 3: US Patent Application Publication No. 2018/0173117

SUMMARY

A tin trap device according to an aspect of the present disclosure may be a tin trap device for collecting tin in a chamber device which causes tin to be turned into plasma with laser light in an internal space thereof, including a housing provided with a gas inlet port through which exhaust gas in the chamber device flows and a gas exhaust port through which the exhaust gas is exhausted; and a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

An extreme ultraviolet light generation apparatus according to an aspect of the present disclosure may include a chamber device configured to cause tin to be turned into plasma with laser light in an internal space thereof, and a tin trap device configured to collect tin in the chamber device. Here, the tin trap device includes a housing provided with a gas inlet port through which exhaust gas in the chamber device flows and a gas exhaust port through which the exhaust gas is exhausted; and a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

An electronic device manufacturing method according to an aspect of the present disclosure may include generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber device configured to cause tin to be turned into plasma with laser light in an internal space thereof, and a tin trap device configured to collect tin in the chamber device. The tin trap device includes a housing provided with a gas inlet port through which exhaust gas in the chamber device flows and a gas exhaust port through which the exhaust gas is exhausted; and a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

BRIEF DESCRIPTION OF THE DRAWINGS

Embodiments of the present disclosure will be described below merely as examples with reference to the accompanying drawings.

DESCRIPTION OF EMBODIMENTS

1. Overview
2. Description of electronic device manufacturing apparatus
3. Description of extreme ultraviolet light generation apparatus of comparative example
   3.1 Configuration
   3.2 Operation
   3.3 Problem 4. Description of Tin Trap Device of First Embodiment
　4.1 Configuration
　4.2 Operation
　4.3 Effect
5. Description of Tin Trap Device of Second Embodiment
　5.1 Configuration
　5.2 Effect
6. Description of Tin Trap Device of Third Embodiment
　6.1 Configuration
　6.2 Operation
　6.3 Effect
7. Description of Tin Trap Device of Fourth Embodiment
　7.1 Configuration
　7.2 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) light, and an electronic device manufacturing apparatus. In the following of the present specification, extreme ultraviolet light is referred to as EUV light in some cases.

2. Description of Electronic Device Manufacturing Apparatus

Figure 1:
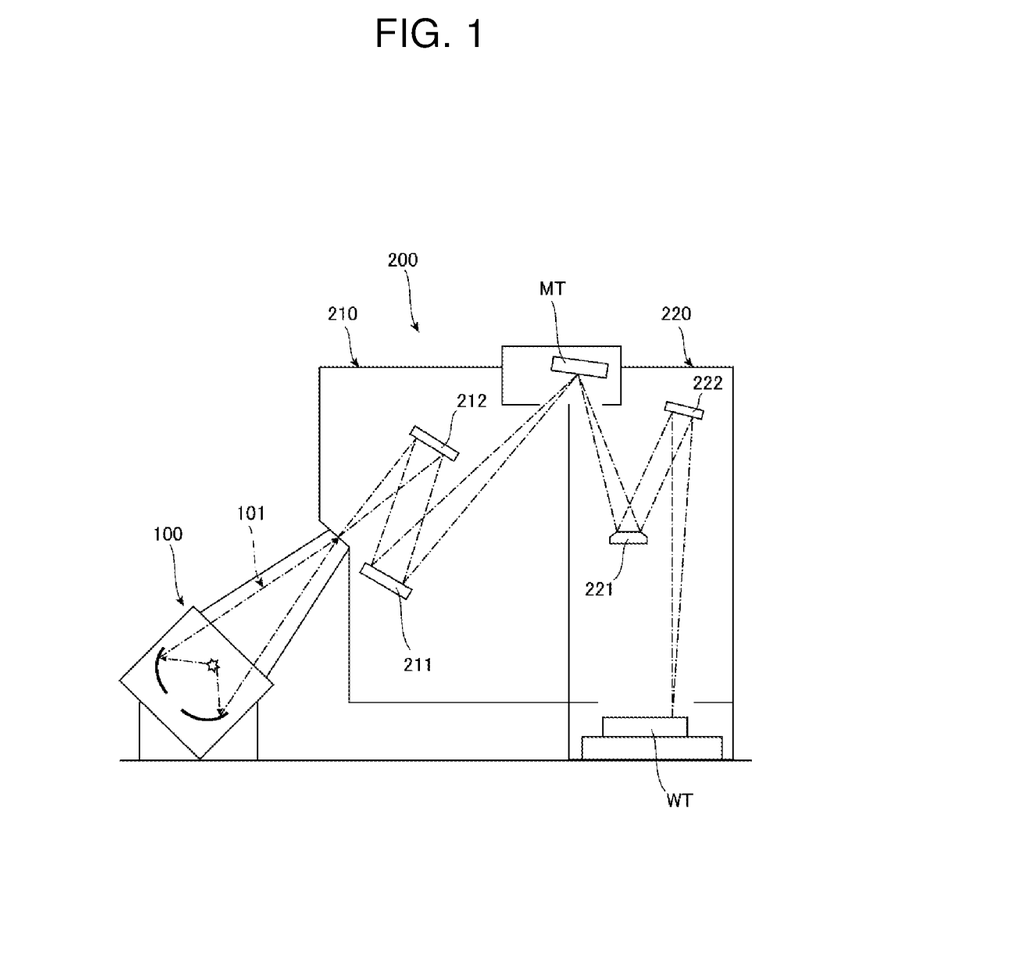
FIG. 1 is a view showing a schematic configuration example of an entire electronic device manufacturing apparatus.

As shown in FIG. 1, an electronic device manufacturing apparatus includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not shown) disposed on the workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
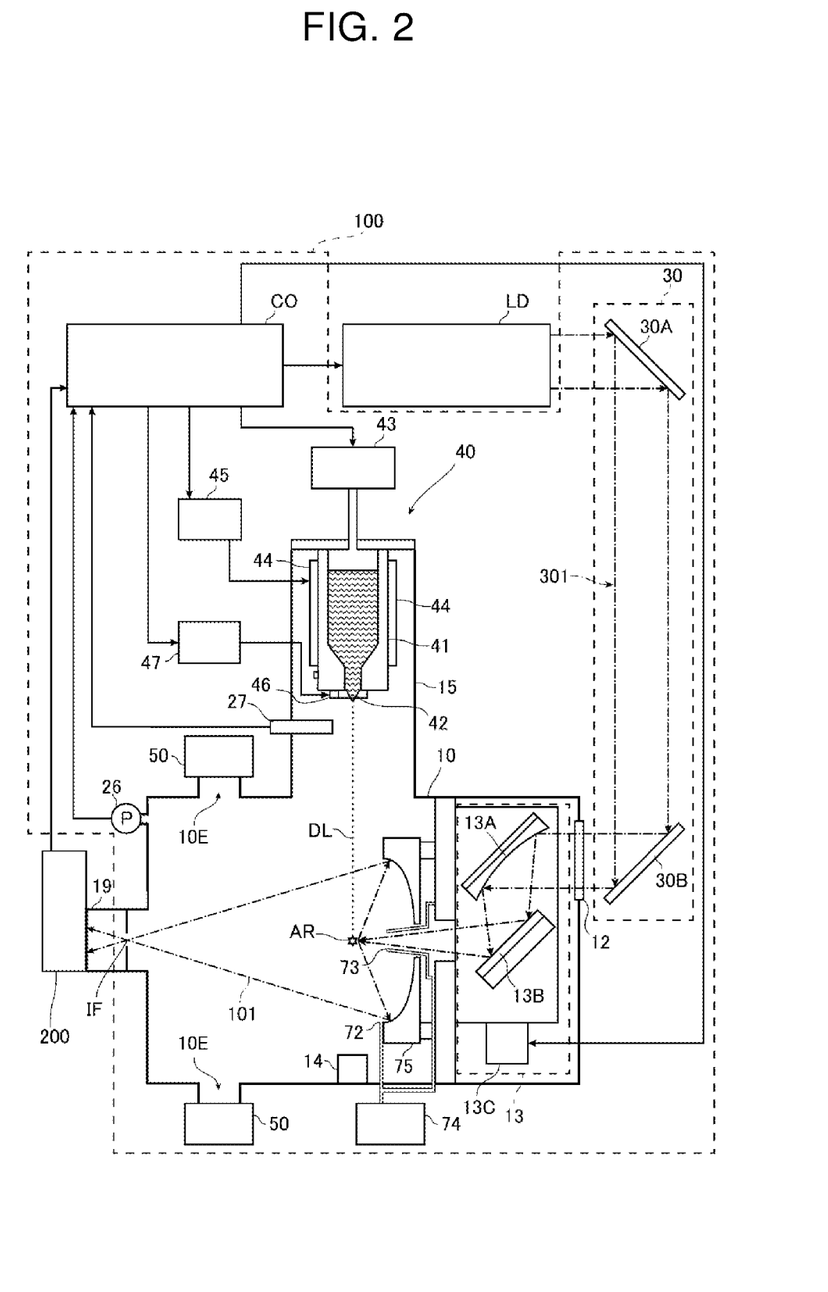
FIG. 2 is a view showing a schematic configuration example of an entire extreme ultraviolet light generation apparatus.

3. Description of Extreme Ultraviolet Light Generation Apparatus of Comparative Example 3.1 Configuration The EUV light generation apparatus of a comparative example will be described. FIG. 2 is a schematic view showing a schematic configuration example of an entire EUV light generation apparatus of the present example. As shown in FIG. 2, a laser device LD is connected to an EUV light generation apparatus 100 of the present example. The EUV light generation apparatus 100 of the present example includes a chamber device 10, a control unit CO, and a laser light delivery optical system 30 as a main configuration.

The chamber device 10 is a sealable container. The chamber device 10 includes a sub-chamber 15, and a target supply unit 40 is provided in the sub-chamber 15. The target supply unit 40 includes a tank 41 and a nozzle 42. The target supply unit 40 supplies a droplet DL to the internal space of the chamber device 10 and is attached, for example, to penetrate through a wall of the sub-chamber 15. The droplet DL, which is also called a target, is supplied from the target supply unit 40.

The tank 41 stores therein a target substance which becomes the droplet DL. The target substance contains tin. The inside of the tank 41 communicates, through a pipe, with a pressure adjuster 43 adjusting gas pressure. Further, a heater 44 is attached to the tank 41. The heater 44 heats the tank 41 with current applied from a heater power source 45. Through the heating, the target substance in the tank 41 melts. The pressure adjuster 43 and the heater power source 45 are electrically connected to the control unit CO.

The nozzle 42 is attached to the tank 41 and outputs the target substance. A piezoelectric element 46 is attached to the nozzle 42. The piezoelectric element 46 is electrically connected to a piezoelectric power source 47 and is driven by voltage applied from the piezoelectric power source 47. The piezoelectric power source 47 is electrically connected to the control unit CO. The target substance output from the nozzle 42 is formed into the droplet DL through operation of the piezoelectric element 46.

The chamber device 10 also includes a target collection unit 14. The target collection unit 14 collects unnecessary droplets DL.

At least one through hole is formed in a wall of the chamber device 10. The through hole is blocked by a window 12 through which pulsed laser light 301 emitted from the laser device LD passes.

Further, a laser light concentrating optical system 13 is arranged in the chamber device 10. The laser light concentrating optical system 13 includes a laser light concentrating mirror 13A and a high reflection mirror 13B. The laser light concentrating mirror 13A reflects and concentrates the laser light 301 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser light concentrating position at the internal space of the chamber device 10 coincides with a position specified by the control unit CO.

For example, an EUV light concentrating mirror 75 having a spheroidal reflection surface is arranged in the chamber device 10. The EUV light concentrating mirror 75 has first and second focal points. The EUV light concentrating mirror 75 may, for example, be arranged so that the first focal point is located in a plasma generation region AR and the second focal point is located at an intermediate focal point IF. A through hole is formed at the center of the EUV light concentrating mirror 75, and the pulse laser light 301 passes through the through hole.

Further, the EUV light generation apparatus 100 includes a connection portion 19 providing communication between the internal space of the chamber device 10 and the internal space of the exposure apparatus 200. A wall in which an aperture is formed is arranged in the connection portion 19.

The wall is preferably arranged such that the aperture is located at the second focal point position of the EUV light concentrating mirror 75.

Further, the EUV light generation apparatus 100 includes a pressure sensor 26. The pressure sensor 26 measures the pressure at the internal space of the chamber device 10. Further, the EUV light generation apparatus 100 includes a target sensor 27 attached to the chamber device 10. The target sensor 27 has, for example, an imaging function, and detects the presence, trajectory, position, velocity, and the like of the droplet DL. The pressure sensor 26 and the target sensor 27 are electrically connected to the control unit CO.

The laser device LD includes a master oscillator being a light source to perform burst operation. The master oscillator emits the pulse laser light 301 in a burst-on duration. The master oscillator is, for example, a laser device configured to emit the laser light by exciting, through electric discharge, gas as mixture of carbon dioxide gas with helium, nitrogen, or the like. Alternatively, the master oscillator may be a quantum cascade laser device. The master oscillator may emit the pulse laser light 301 by a Q switch system. The master oscillator may include an optical switch, a polarizer, and the like. In the burst operation, the pulse laser light 301 is continuously emitted at a predetermined repetition frequency in the burst-on duration and the emission of the laser light 301 is stopped in a burst-off duration.

The travel direction of the laser light 301 emitted from the laser device LD is adjusted by the laser light delivery optical system 30. The laser light delivery optical system 30 includes a plurality of mirrors 30A and 30B for adjusting the travel direction of the laser light 301, and a position of at least one of the mirrors 30A and 30B is adjusted by an actuator (not shown). Owing to that the position of at least one of the mirrors 30A and 30B is adjusted, the laser light 301 can appropriately propagate into the chamber device 10 through the window 12.

As the control unit CO, for example, an integrated circuit such as a microcontroller, an integrated circuit (IC), a large-scale integrated circuit (LSI), and an application specific integrated circuit (ASICs) or a numerical control (NC) device can be used. When the NC device is used, the control unit CO may use a machine learning device or may not use a machine learning device. The control unit CO controls the entire EUV light generation apparatus 100 and also controls the laser device LD. The control unit CO receives a signal related to the pressure at the internal space of the chamber device 10, which is measured by the pressure sensor 26, a signal related to image data of the droplet DL captured by the target sensor 27, a burst signal from the exposure apparatus 200, and the like. The control unit CO is configured to process the image data and the like, and to control, for example, timing at which the droplet DL is output, an output direction of the droplet DL, and the like. Such various kinds of control described above are merely exemplary, and other control is added as described later.

Next, the configuration of the chamber device 10 will be described in more detail.

Figure 3:
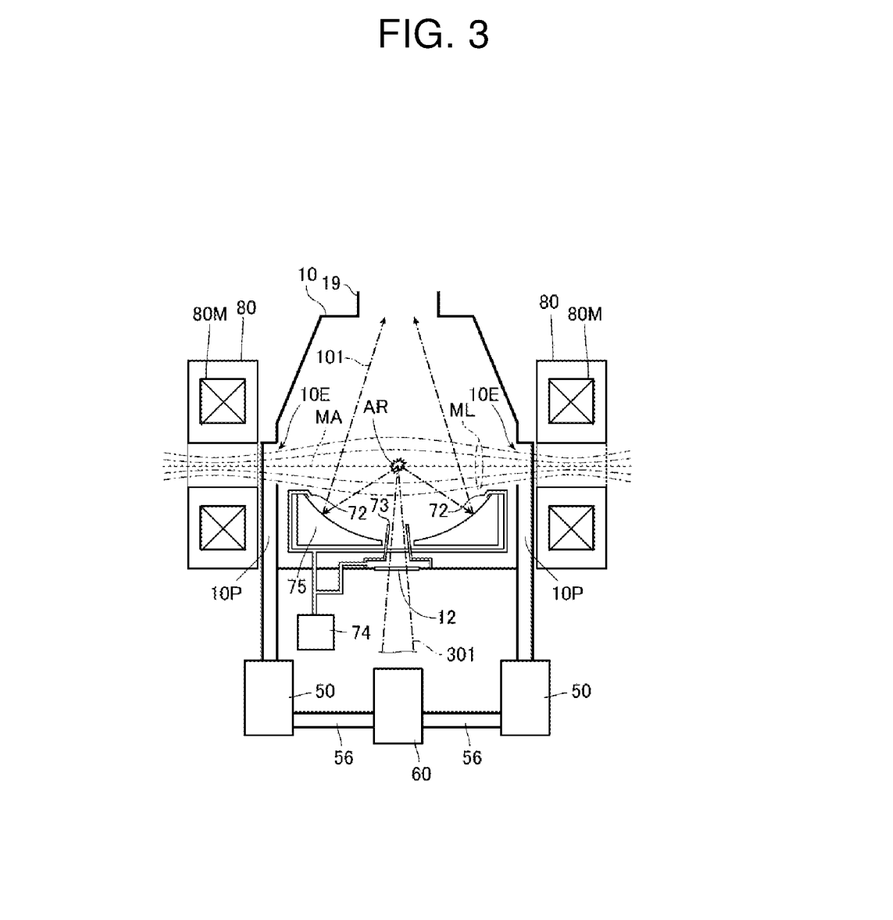
FIG. 3 is a view showing a schematic configuration of a part including a chamber device.

FIG. 3 is a view showing a schematic configuration of a part including the chamber device. In FIG. 3, the laser light concentrating optical system 13 is omitted. As shown in FIGS. 2 and 3, the chamber device 10 is provided with a first gas supply unit 72 and a second gas supply unit 73 for supplying etching gas to the internal space of the chamber device 10. The first gas supply unit 72 and the second gas supply unit 73 are connected to the gas supply tank 74 which supplies the etching gas through pipes. As described above, since the target substance contains tin, the etching gas is, for example, balance gas having a hydrogen gas concentration of about 3%. The balance gas may include nitrogen ($N_2$) gas or argon (Ar) gas. Here, a supply gas amount adjustment unit (not shown) may be arranged at a pipe between the gas supply tank 74 and at least one of the first gas supply unit 72 and the second gas supply unit 73.

The first gas supply unit 72 is adjusted so that the etching gas supplied into the chamber device 10 flows along a reflection surface from the outer periphery of the EUV light concentrating mirror 75. The second gas supply unit 73 has a shape of a side surface of a circular truncated cone and is called a cone in some cases. A gas supply port of the second gas supply unit 73 is inserted into the through hole formed in the EUV light concentrating mirror 75, and the second gas supply unit 73 supplies the etching gas from the through hole in a direction away from the EUV light concentrating mirror 75. Further, the laser light 301 passes through the through hole of the EUV light concentrating mirror 75 through the second gas supply unit 73, as described above. Therefore, the window 12 side of the second gas supply unit 73 is configured so that the laser light 301 can pass therethrough.

Fine particles and charged particles of tin are generated when the target substance constituting the droplet DL is turned into plasma in the plasma generation region AR. The etching gas supplied from the first gas supply unit 72 and the second gas supply unit 73 contains hydrogen that reacts with tin constituting the fine particles and charged particles. Through the reaction with hydrogen, tin becomes stannane ($SnH_4$) gas at room temperature.

A pair of exhaust ports 10E are formed at the chamber device 10. As shown in FIG. 3, the respective exhaust ports 10E are formed, for example, at positions facing each other on the wall of the chamber device 10. Residual gas contains fine particles and charged particles of tin generated through the plasma generation from the target substance, stannane generated through the reaction of the fine particles and charged particles of tin with the etching gas, and unreacted etching gas. Some of the charged particles are neutralized in the chamber device 10, and the residual gas contains the neutralized charged particles as well. The exhaust port 10E through which the residual gas is exhausted is connected to an exhaust pipe 10P, and the exhaust pipe 10P is connected to a tin trap device 50. Therefore, the residual gas exhausted from the exhaust port 10E flows into the tin trap device 50 through the exhaust pipe 10P.

Further, the EUV light generation apparatus 100 includes a magnetic field generation unit 80. The magnetic field generation unit 80 is configured to generate a magnetic field ML for the charged particles generated in the plasma generation region AR to converge to the exhaust port 10E. The magnetic field generation unit 80 may, for example, be configured by a pair of electromagnets 80M arranged so as to sandwich the wall of the chamber device 10 facing each other. The pair of electromagnets 80M are arranged such that the plasma generation region AR is positioned midway between the respective electromagnets 80M. The direction of the current flowing through a superconducting coil of one electromagnet 80M is the same as the direction of the current flowing through a superconducting coil of the other electromagnet 80M. When such current is applied to a pair of the superconducting coils, the magnetic field ML is generated in which the magnetic flux density is highest in the vicinity of the respective electromagnets 80M, and the magnetic flux density becomes lower toward the plasma generation region AR. A magnetic field axis MA of the magnetic field ML preferably crosses a reflective light path of the EUV light concentrating mirror 75 and preferably passes through the plasma generation region AR. The magnetic field ML is called a mirror magnetic field in some cases.

Here, the magnetic field generation unit 80 may generate a magnetic field for the charged particles to converge from one electromagnet 80M side to the other electromagnet 80M side through the plasma generation region AR. Further, the magnetic field generation unit 80 is configured by the pair of electromagnets 80M but may be configured by a pair of permanent magnets. Further, the electromagnets 80M or the permanent magnets that are magnets for generating the magnetic field may be arranged in the chamber device 10.

Further, as described above, in the present example, the exhaust ports 10E are provided at positions facing each other on the wall of the chamber device 10, and the residual gas including the charged particles is exhausted from the exhaust ports 10E. Therefore, in the example shown in FIG. 3, the pair of exhaust ports 10E are provided at positions facing each other along the magnetic field axis MA and through which the magnetic field axis MA passes in the chamber device 10.

Next, the tin trap device 50 will be described in more detail.

Figure 4:
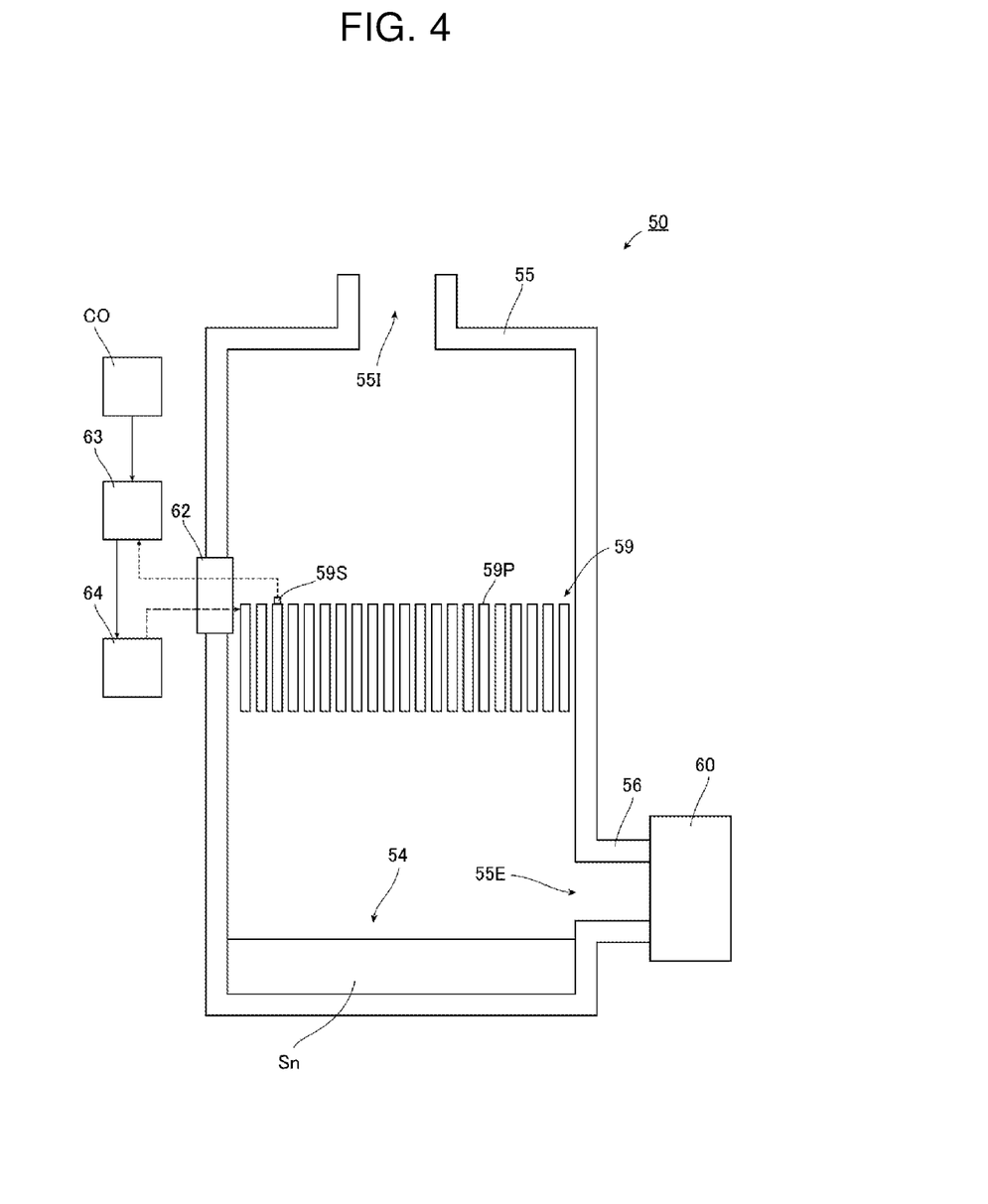
FIG. 4 is a view showing a schematic configuration of a tin trap device according to a comparative example.

FIG. 4 is a view showing the tin trap device according to the present example. As shown in FIG. 4, the tin trap device 50 includes a housing 55 and a heater 59 as a main configuration.

The housing 55 has a shape, the longitudinal direction of which extends in the vertical direction, and a gas inlet port 55I is arranged at the ceiling wall of the housing 55. The gas inlet port 55I is connected to the exhaust pipe 10P, and the residual gas from the chamber device 10 flows into the housing 55 from the gas inlet port 55I as exhaust gas. In the present example, the direction in which the exhaust gas flows into the gas inlet port 55I is downward in FIG. 4. Further, a gas exhaust port 55E through which gas in the housing 55 is exhausted is arranged at a side wall of the housing 55. The gas exhaust port 55E is connected to an exhaust pipe 56. The exhaust pipe 56 extends substantially horizontally and is connected to the exhaust pump 60.

The heater 59 is arranged in the housing 55. The heater 59 includes a plurality of plate-shaped heating elements 59P. The respective heating elements 59P are arranged side by side in the horizontal direction at predetermined intervals in a state of being erected in the vertical direction. Therefore, the gaps between the heating elements 59P can be viewed when the heater 59 is viewed along the inflow direction of the exhaust gas flowing in from the gas inlet port 55I of the housing 55.

A heater power source 64 is arranged outside the housing 55. The heater power source 64 is electrically connected to the heater 59 through a feedthrough 62 arranged at the housing 55, and applies current to the heater 59. The heating elements 59P of the heater 59 generate heat by the current applied from the heater power source 64.

A temperature sensor 59S for detecting the temperature of the heater 59 is arranged at the heater 59. A temperature controller 63 is arranged outside the housing 55. The temperature controller 63 is electrically connected to the temperature sensor 59S through the feedthrough 62, and is also electrically connected to the heater power source 64 and the control unit CO. A signal from the control unit CO and a signal from the temperature sensor 59S are input to the temperature controller 63, and the temperature controller 63 adjusts the current applied to the heater 59 by the heater power source 64 based on these signals.

The temperature of the heater 59 becomes equal to or higher than the melting point of tin and lower than the boiling point thereof by the current from the heater power source 64. That is, the temperature of the heater 59 becomes equal to 231.93° C. or higher and lower than 2602° C. Therefore, when charged particles or fine particles of tin come in contact with the surface of the heater 59, they adhere in a liquid state. Since the decomposition temperature of stannane is approximately 40° C., stannane can be decomposed into hydrogen and tin by the heat from the heater 59.

Further, the bottom wall of the housing 55 serves as a drain tank 54 in which tin is accumulated.

3.2 Operation

Next, operation of the EUV light generation apparatus 100 of the comparative example will be described. In the EUV light generation apparatus 100, for example, at the time of new installation, maintenance, or the like, atmospheric air in the chamber device 10 is exhausted. At this time, purge and exhaust may be repeated in the chamber device 10 to exhaust atmospheric components. For example, inert gas such as nitrogen ($N_2$) or argon (Ar) is preferably used for the purge gas. Thereafter, when the pressure in the chamber device 10 becomes equal to or lower than a predetermined pressure, the control unit CO starts introducing the etching gas from the first gas supply unit 72 and the second gas supply unit 73 into the chamber device 10. At this time, the control unit CO may control the supply gas amount adjustment unit (not shown) and the exhaust pump 60 so that the pressure at the internal space of the chamber device 10 is maintained at the predetermined pressure. Thereafter, the control unit CO waits until a predetermined time elapses from the start of introduction of the etching gas.

Further, the control unit CO drives the electromagnets 80M of the magnetic field generation unit 80 to generate the magnetic field ML. Further, the control unit CO causes the gas in the chamber device 10 to be exhausted from the exhaust port 10E by the exhaust pump 60, and keeps the pressure in the chamber device 10 substantially constant based on the signal of the pressure in the chamber device 10 measured by the pressure sensor 26. At this time, the pressure in the chamber device 10 is, for example, 10 Pa to 160 Pa.

In order to heat and maintain the target substance in the tank 41 at a predetermined temperature equal to or higher than the melting point, the control unit CO causes the heater power source 45 to apply current to the heater 44 to increase temperature of the heater 44. In this case, the control unit CO controls the temperature of the target substance to the predetermined temperature by adjusting a value of the current applied from the heater power source 45 to the heater 44 based on an output from a temperature sensor (not illustrated). The predetermined temperature is, for example, 250° C. to 290° C. when the target substance is tin.

Further, the control unit CO causes the pressure adjuster 43 to adjust the pressure in the tank 41 so that the melted target substance is output through the hole of the nozzle 42 at a predetermined speed. The target substance output through the hole of the nozzle 42 may be in the form of jet. At this time, the control unit CO causes the piezoelectric power source 47 to apply a voltage having a predetermined waveform to the piezoelectric element 46 to generate the droplet DL. Vibration of the piezoelectric element 46 can propagate through the nozzle 42 to the target substance to be discharged through the hole of the nozzle 42. The target substance is divided at a predetermined cycle by the vibration, and a liquid droplet DL is generated from the target substance.

Further, the control unit CO outputs a light emission trigger signal to the laser device LD. When the light emission trigger signal is input, the laser device LD emits the pulse laser light 301. The emitted laser light 301 is incident on the laser light concentrating optical system 13 through the laser light delivery optical system 30 and the window 12. At this time, the control unit CO controls the laser light manipulator 13C of the laser light concentrating optical system 13 such that the laser light 301 is concentrated in the plasma generation region AR. The control unit CO causes the laser device LD to emit the laser light 301 based on the signal from the target sensor 27 so that the droplet DL is irradiated with the laser light 301. Accordingly, the droplet DL is irradiated in the plasma generation region AR with the laser light 301 converged by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 75, and then is incident on the exposure apparatus 200 from the connection portion 19. Therefore, it can be understood that the connection portion 19 is the emission port of the EUV light in the EUV light generation apparatus 100.

When the target substance is turned into plasma, charged particles of tin are generated as described above. The charged particles move on a trajectory rotating in a plane perpendicular to the magnetic field line by receiving a Lorentz force from the magnetic field ML. When the charged particles moving in this manner have velocity components in the direction to the exhaust port 10E, the charged particles are directed toward the wall of the chamber device 10 while converging in a spiral trajectory along the magnetic field lines. Accordingly, most of the charged particles are guided to the exhaust port 10E provided on the wall of the chamber device 10 near the converging portion of the magnetic field ML, and flow into the exhaust port 10E.

Further, when the target substance is turned into plasma, electrically neutral fine particles of tin are generated as described above. Not being affected by the magnetic field ML generated by the magnetic field generation unit 80, the fine particles are diffused into the chamber device 10. Some of the fine particles diffused into the chamber device 10 adhere to a reflection surface of the EUV light concentrating mirror 75. The fine particles adhering to the reflection surface react with the hydrogen-containing etching gas supplied from the first gas supply unit 72 and the second gas supply unit 73, and become stannane. Most of the stannane obtained through the reaction with the etching gas flows into the exhaust port 10E along with the flow of the unreacted etching gas.

Further, at least some of the charged particles not converged to the exhaust port 10E by the magnetic field ML and the fine particles without adhering to the reflection surface of the EUV light concentrating mirror 75 may become stannane through reaction with some of the unreacted etching gas flowing in the chamber device 10. Most of the stannane generated through the reaction flows into the exhaust port 10E along with the flow of the unreacted etching gas. At least some of the unreacted charged particles, fine particles, and etching gas flow into the exhaust port 10E.

The unreacted etching gas, fine particles, charged particles, stannane, and the like flowed into the exhaust port 10E flow as the exhaust gas from the exhaust pipe 10P into the housing 55 through the gas inlet port 55I of the tin trap device 50. At this time, the flow velocity of the exhaust gas is, for example, 100 to 300 m/s, and the temperature is, for example, 500 to 2000° C. Accordingly, stannane flowed into the housing 55 is substantially decomposed into hydrogen and tin. The charged particles and fine particles flowed into the housing 55 and some of tin generated from stannane adhere to the heater 59 in a liquid state. Further, hydrogen generated from stannane and undecomposed stannane pass between the heating elements 59P of the heater 59, and flow into the exhaust pump 60.

The liquid tin adhering to the heater 59 falls downward by gravity and accumulates in the drain tank 54.

3.3 Problem

In the heater 59 of the tin trap device 50 of the comparative example, as described above, the respective heating elements 59P are arranged side by side in the horizontal direction at predetermined intervals in a state of being erected in the vertical direction. Therefore, some of the charged particles and fine particles of tin and the like linearly advancing from the gas inlet port 55I may pass between the heating elements 59P and flow into the exhaust pump 60. When the charged particles and fine particles flowed into the exhaust pump 60 become solid in the exhaust pump 60, tin may adhere to the inside of the exhaust pump 60 and decrease the reliability of the exhaust pump 60. There is a concern that the reliability of the EUV light generation apparatus 100 may be decreased due to the decrease of the gas exhaust capability in the chamber device 10.

In addition, hydrogen generated from stannane is stored together with tin in the drain tank 54, and bubbles of the hydrogen may burst to scatter fine particles of liquid tin. When the fine particles penetrate between the heating elements 59P and enter the chamber device 10, tin may adhere to the EUV light concentrating mirror 75. In this case, the reflectance of the EUV light concentrating mirror 75 is decreased, and there is a concern that the reliability of the EUV light generation apparatus 100 is decreased.

Therefore, the following embodiments exemplify a tin trap device capable of suppressing decrease in the reliability of the EUV light generation apparatus 100.

4. Description of Tin Trap Device of First Embodiment

Next, the configuration of the tin trap device according to a first embodiment will be described. Any component same as that described above is denoted by an identical reference sign, and duplicate description thereof is omitted unless specific description is needed.

4.1 Configuration

Figure 5:
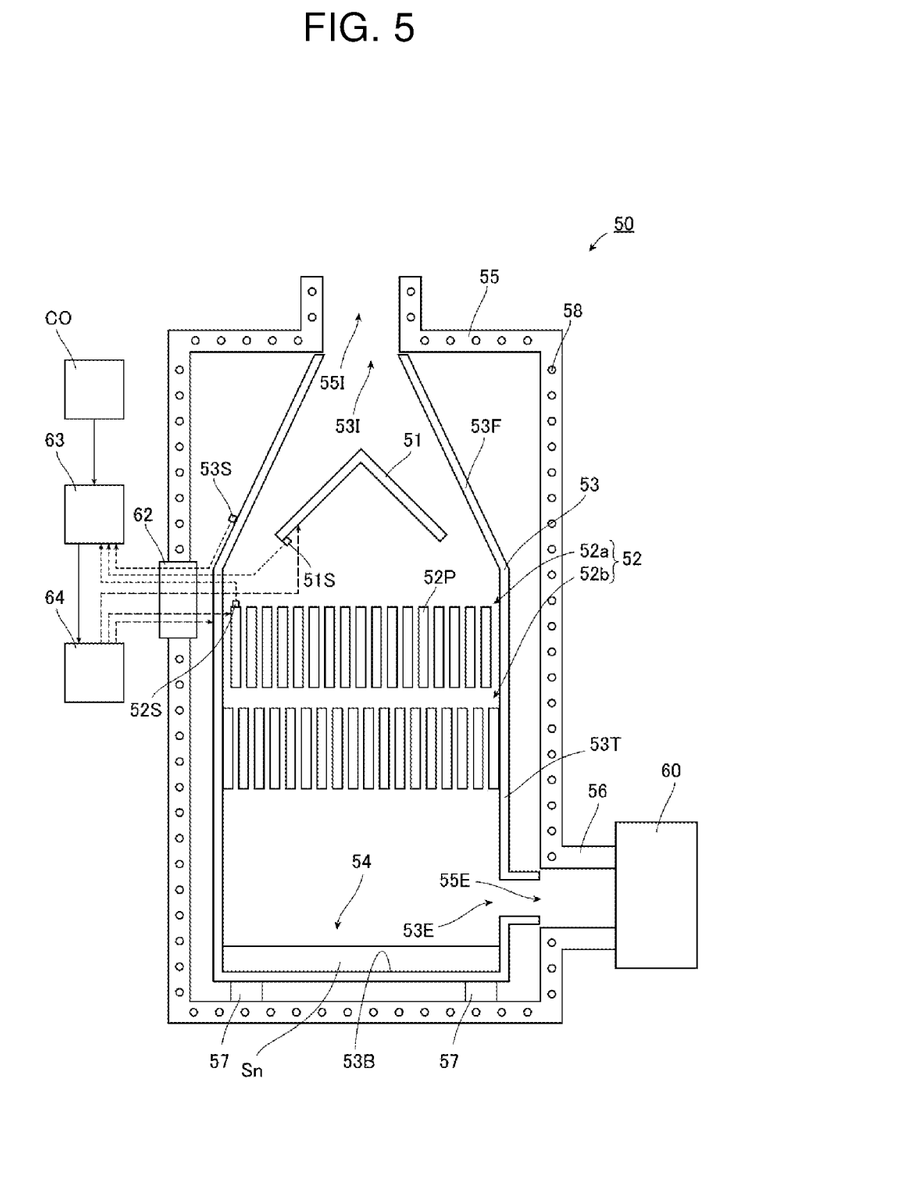
FIG. 5 is a view showing a schematic configuration of the tin trap device according to a first embodiment.

FIG. 5 is a view showing the tin trap device according to the present embodiment. As shown in FIG. 5, the tin trap device 50 of the present embodiment includes a main heater 51, a sub-heater 52, and a surrounding heater 53 in the housing 55 as a main configuration.

A water cooling pipe 58 is arranged in the wall of the housing 55 of the present embodiment, and the housing 55 is cooled to be lower than 40° C., which is the decomposition temperature of stannane, and equal to or higher than 1° C., which is the temperature at which water does not freeze, by a liquid such as water introduced into the water cooling pipe 58. Here, the water cooling pipe 58 may be arranged on the inner wall or the outer wall of the housing 55. Further, the area of the gas inlet port 55I of the housing 55 is, for example, 10 $cm^2$ or more and 3000 $cm^2$ or less.

The main heater 51 has a shape in which the bottom surface of a cone shape such as a cone or a pyramid is opened, and is arranged below the gas inlet port 55I of the housing 55 with the apex thereof oriented toward the gas inlet port 55I. The direction in which the exhaust gas flows into the gas inlet port 55I in the present embodiment is downward as in the comparative example. Accordingly, the main heater 51 is arranged at a position to easily come in contact with the exhaust gas flowing in from the gas inlet port 55I. Further, when the main heater 51 is projected toward the direction in which the exhaust gas flows into the gas inlet port 55I, the projection surface covers the gas inlet port 55I. Therefore, fine particles and charged particles of tin contained in the exhaust gas flowing into the housing 55 from the gas inlet port 55I easily come in contact with the main heater 51. The area of the projection surface of the main heater 51 is preferably equal to or mote than 1.1 times and equal to or less than 10 times, and more preferably, equal to or more than 2 times and equal to or less than 5 times the area of the gas inlet port 55I, for example. Therefore, for example, when the area of the gas inlet port 55I is 100 cm$^2$, the area of the projection surface of the main heater 51 is preferably equal to or more than 110 cm$^2$ and equal to or less than 1000 cm$^2$, and more preferably, equal to or more than 200 cm$^2$ and equal to or less than 500 cm$^2$.

The sub-heater 52 is arranged downstream of the main heater 51 in the flow of the exhaust gas. Therefore, the sub-heater 52 is arranged at a position aligned with the main heater 51 in the direction in which the exhaust gas flows into the gas inlet port 55I. In addition, the sub-heater 52 is arranged such that a part thereof overlaps the main heater 51 and another part thereof does not overlap the main heater 51 in the direction in which the exhaust gas flows into the gas inlet port 55I. The sub-heater 52 includes a plurality of heating element groups 52a, 52b each including a plurality of plate-shaped heating elements 52P. In the present embodiment, the surface area of the sub-heater 52 is larger than the surface area of the main heater 51. The heating element group 52a and the heating element group 52b are aligned to overlap each other in the direction in which the exhaust gas flows into the gas inlet port 55I. For example, the dimension of each heating element 52P is preferably 1 mm or more and 20 mm or less in thickness, 10 mm or more and 500 mm or less in length in the depth direction of the paper surface of FIG. 5, and 10 mm or more and 500 mm or less in length in the vertical direction, and more preferably, 3 mm or more and 10 mm or less in thickness, 50 mm or more and 200 mm or less in length in the depth direction of the paper surface of FIG. 5, and 50 mm or more and 200 mm or less in length in the vertical direction.

The heating elements 52P of the respective heating element groups 52a and 52b are arranged as being overlapped side by side in the horizontal direction in a state of being erected in the vertical direction. That is, the heating elements 52P of the respective heating element groups 52a, 52b are arranged with the in-plane direction of each main surface oriented along the direction in which the exhaust gas flows into the gas inlet port 55I as being overlapped in a direction perpendicular to the direction. The arrangement positions of the heating elements 52P of the heating element group 52a and the arrangement positions of the heating elements 52P of the heating element group 52b are horizontally shifted from each other. In the present embodiment, the distance between the heating elements 52P is equal to or less than the thickness of the heating element 52P, and when viewed along the direction in which the exhaust gas flows in the gas inlet port 55I, the space between the heating elements 52P of the heating element group 52a is filled with the heating element 52P of the heating element group 52b. Therefore, the projection surface of the sub-heater 52 projected toward the direction in which the exhaust gas flows in the gas inlet port 55I covers the gas inlet port 55I.

The surrounding heater 53 has a shape in which a truncated-cone-shaped portion 53F having both bottom surfaces opened and a cylindrical portion 53T having one end closed are connected. Further, an opening 53E is formed on the side surface of the cylindrical portion 53T. A small-diameter opening 53I of the truncated-cone-shaped portion 53F is formed in the vicinity of the gas inlet port 55I, and the opening 53E of the cylindrical portion 53T is formed in the vicinity of the gas exhaust port 55E of the housing 55. Therefore, the exhaust gas flowing in from the gas inlet port 55I of the housing 55 passes through the internal space of the surrounding heater 53 from the opening 53I to reach the opening 53E, and is exhausted from the gas exhaust port 55E of the housing 55.

A portion closing one end part of the cylindrical portion 53T is the bottom surface 53B of the surrounding heater 53, and the drain tank 54 is configured by the bottom surface 53B and a part of the cylindrical portion 53T. The drain tank 54 holds the accumulated tin at, for example, 230° C. or more and 500° C. or less. Therefore, tin accumulated in the drain tank 54 is maintained in a liquid state.

The surrounding heater 53 is arranged in the housing 55 so as not to be in contact with the inner wall of the housing 55. Therefore, a pedestal 57 is arranged between the bottom surface 53B of the surrounding heater 53 and the housing 55. The pedestal 57 is preferably formed of a member having low thermal conductivity from the viewpoint of suppressing conduction of heat of the surrounding heater 53 to the housing 55. Examples of such a member can include ceramic.

The surrounding heater 53 surrounds the main heater 51 as being spaced apart from the main heater 51 in a direction perpendicular to the direction in which the exhaust gas flows into the gas inlet port 55I, and surrounds the sub-heater 52 in the above direction.

The main heater 51, the sub-heater 52, and the surrounding heater 53 are preferably formed of a material that is less prone to corrosion against tin. Examples of such a material include a metal coated with molybdenum (Mo), tungsten (W), titanium oxide (TiO), titanium nitride (TiN), zirconium oxide (ZrO), zirconium nitride (ZrN), and the like.

The main heater 51 is provided with a temperature sensor 51S, the sub-heater 52 is provided with a temperature sensor 52S, and the surrounding heater 53 is provided with a temperature sensor 53S. The temperature sensors 51S to 53S are electrically connected to the temperature controller 63 through the feedthrough 62. Further, the main heater 51, the sub-heater 52, and the surrounding heater 53 are electrically connected to the heater power source 64 through the feedthrough 62.

With the current from the heater power source, the temperature of each of the main heater 51, the sub-heater 52, and the surrounding heater 53 becomes equal to or higher than the melting point of tin and lower than the boiling point thereof, that is, equal to or higher than 231.93° C. and lower than 2602° C. Therefore, when coming in contact with the main heater 51, the sub-heater 52, and the surrounding heater 53, the charged particles and fine particles of tin and tin generated by decomposition of stannane adhere thereto in a liquid state.

4.2 Operation

Similarly to the EUV light generation apparatus 100 of the comparative example, when the residual gas in the chamber device 10 flows into the housing 55 of the tin trap device 50 as the exhaust gas, at least some of stannane contained in the exhaust gas is decomposed into hydrogen and tin. Therefore, the exhaust gas contains the charged particles and fine particles of tin and tin generated from stannane. When at least some of the tin contained in the exhaust gas comes in contact with the main heater 51, the tin adheres to the main heater 51 in a liquid state. At least some of the tin without adhering to the main heater 51 adheres to the sub-heater 52 and the surrounding heater 53 in a liquid state.

Tin adhering to the main heater 51, the sub-heater 52, and the surrounding heater 53 falls downward by gravity and is stored in the drain tank 54. Tin stored in the drain tank 54 is kept in a liquid state by the heat of the surrounding heater 53.

In this manner, the exhaust gas in which the content of tin is suppressed by the main heater 51, the sub-heater 52, and the surrounding heater 53 is sucked into the exhaust pump 60 from the gas exhaust port 55E of the housing 55 through the exhaust pipe 56.

4.3 Effect

In the tin trap device 50 of the present embodiment, the projection surface of the main heater 51 projected toward the direction in which the exhaust gas flows in the gas inlet port 55I covers the gas inlet port 55I. Therefore, tin flowing in from the gas inlet port 55I easily comes in contact with the main heater 51. Therefore, as compared with the case where a region where the heater 59 is not arranged is viewed when viewed along the inflow direction of the exhaust gas flowing in from the gas inlet port 55I of the housing 55 as in the tin trap device 50 of the comparative example, more tin can be captured. Therefore, it is possible to suppress tin from being sucked into the exhaust pump 60.

Further, since the projection surface of the main heater 51 covers the gas inlet port 55I as described above, the main heater 51 can suppress fine particles of tin from coming out of the gas inlet port 55I even when fine particles of tin are scattered by the burst of the bubbles of hydrogen stored in the drain tank 54.

Therefore, according to the tin trap device 50 of the present embodiment, it is possible to suppress decrease in the reliability of the EUV light generation apparatus 100.

Further, the main heater 51 of the present embodiment has a conical shape with the bottom face thereof opened, and the apex thereof is oriented toward the gas inlet port 55I. Therefore, increase in resistance to the exhaust gas flowing in from the gas inlet port 55I can be suppressed. The shape of the main heater 51 is not limited to the above embodiment.

Further, the tin trap device 50 of the present embodiment includes the sub-heater 52 arranged downstream of the main heater 51 in the flow of the exhaust gas. Therefore, tin without adhering to the main heater 51 can be caused to adhere to the sub-heater 52, and a larger amount of tin can be captured than in the case where the sub-heater 52 is not arranged. In addition, the sub-heater 52 is arranged such that a part thereof overlaps the main heater 51 and another part thereof does not overlap the main heater 51 in the direction in which the exhaust gas flows into the gas inlet port 55I. Therefore, even when some part of tin passing by the side of the main heater 51 proceeds around behind the main heater 51, the tin can be captured by a part of the sub-heater 52. Further, even when some other part of the tin passing by the side of the main heater 51 proceeds in a region not overlapping the main heater 51, the tin can be captured by another part of the sub-heater 52.

Further, in the present embodiment, since the surface area of the sub-heater 52 is larger than the surface area of the main heater 51, tin passing by the side of the main heater 51 can be captured as compared with the case where the surface area of the sub-heater 52 is smaller than the surface area of the main heater 51.

Further, the projection surface of the sub-heater 52 projected toward the direction in which the exhaust gas flows in the gas inlet port 55I covers the gas inlet port 55I. Accordingly, the sub-heater 52 can suppress fine particles of tin from coming out of the gas inlet port even when fine particles of tin are scattered by the burst of the bubbles of hydrogen stored in the drain tank 54.

Here, the number of the heating element groups of the sub-heater 52 may be one. In this case, for example, the main surface of the heating elements 52P may be arranged obliquely with respect to the direction in which the exhaust gas flows in the gas inlet port 55I, such that the projection surface of the sub-heater 52 may cover the gas inlet port 55I. Further, the number of the heating element groups of the sub-heater 52 may be three or more.

Further, in the present embodiment, when viewed along the direction in which the exhaust gas flows in the gas inlet port 55I, the space between the heating elements 52P of the heating element group 52a of the sub-heater 52 is filled with the heating element 52P of the heating element group 52b. Therefore, tin passing between the heating elements 52P of the heating element group 52a easily come in contact with the heating element 52P of the heating element group 52b. Therefore, tin is easily captured by the sub-heater 52.

In addition, the tin trap device 50 of the present embodiment includes the surrounding heater 53 that is spaced apart from the main heater 51 and surrounds the main heater 51. Accordingly, at least some of the tin passing by the main heater 51 may adhere to the surrounding heater 53. Therefore, as compared with the case where the tin trap device 50 does not include the surrounding heater 53, more tin can be captured. Further, since the surrounding heater 53 is spaced apart from the inner wall of the housing 55, the housing 55 can be suppressed from being heated.

Further, in the tin trap device 50 of the present embodiment, the drain tank 54 is formed as a part of the surrounding heater 53. Therefore, tin in the drain tank 54 can be kept in a molten state, and a tin column can be suppressed from growing from the lower side due to tin solidification. Further, since the drain tank 54 is spaced apart from the housing 55, tin in the drain tank 54 is suppressed from being cooled by the housing 55, and the housing 55 is suppressed from being heated by the tin in the drain tank 54.

Further, in the tin trap device 50 of the present embodiment, the housing 55 is cooled to a temperature lower than the decomposition temperature of stannane. Accordingly, even when stannane comes in contact with the housing 55, decomposition thereof is suppressed. Therefore, tin generated by decomposition of stannane is suppressed from adhering to the housing 55 in a solid state.

5. Description of Tin Trap Device of Second Embodiment

Next, the tin trap device of a second embodiment will be described. Any component same as that described above is denoted by an identical reference sign, and duplicate description thereof is omitted unless specific description is needed.

5.1 Configuration

Figure 6:
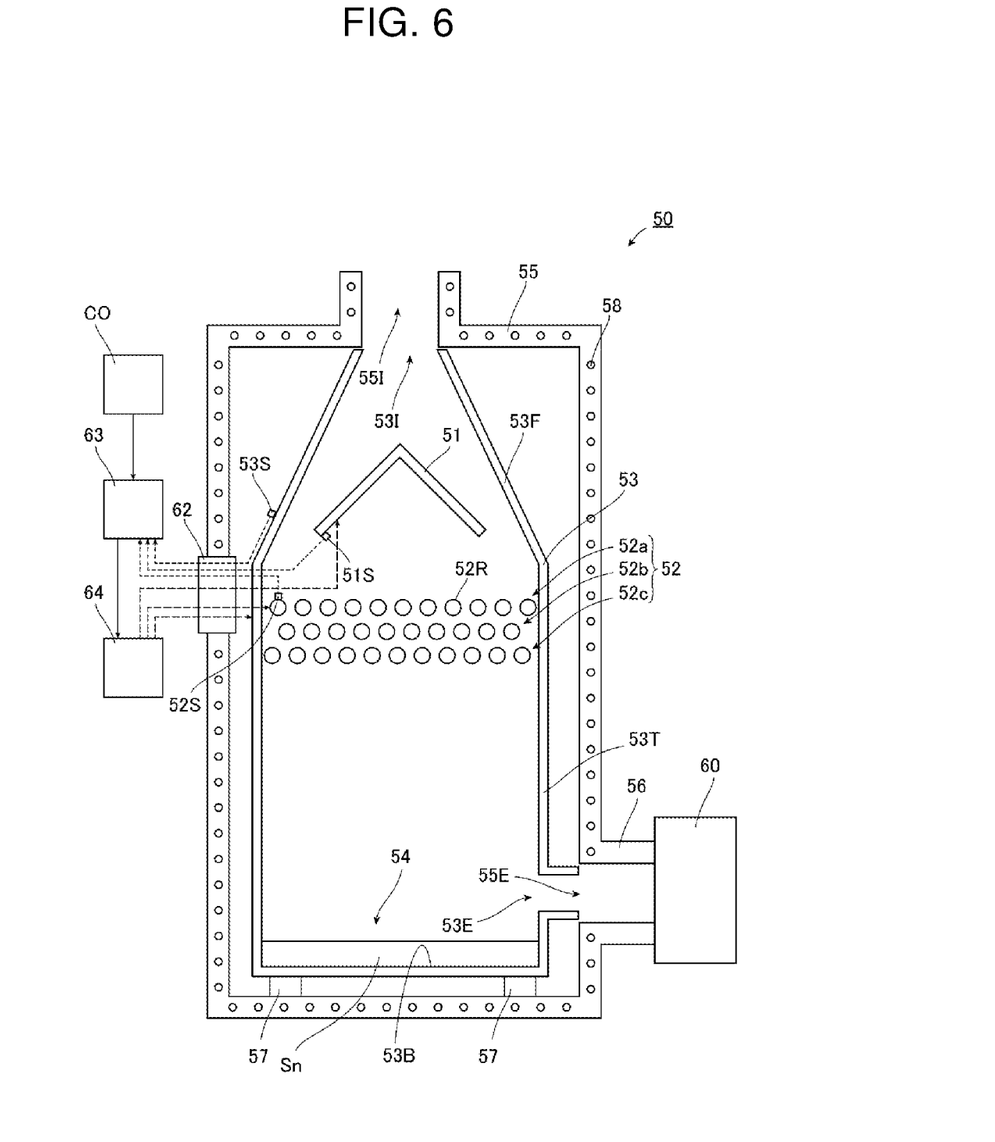
FIG. 6 is a view showing a schematic configuration of the tin trap device according to a second embodiment.

FIG. 6 is a view showing the tin trap device according to the present embodiment. As shown in FIG. 6, in the tin trap device 50 of the present embodiment, a sub-heater 52 is different from the sub-heater 52 of the first embodiment.

Similarly to the sub-heater 52 of the first embodiment, the sub-heater 52 of the present embodiment is arranged downstream of the main heater 51 in the flow of the exhaust gas such that a part of the sub-heater 52 overlaps the main heater 51 and another part of the sub-heater 52 does not overlap the main heater 51. Further, the sub-heater 52 of the present embodiment includes a plurality of heating element groups 52a to 52c each including a plurality of rod-shaped heating elements 52R. Accordingly, the surface area of the sub-heater 52 is larger than the surface area of the main heater 51. The heating element group 52a, the heating element group 52b, and the heating element group 52c overlap each other in the direction in which the exhaust gas flows into the gas inlet port 55I. For example, the dimension of each heating element 52R is preferably 1 mm or more and 100 mm or less in diameter, and 10 mm or more and 300 mm or less in length, and more preferably, 5 mm or more and 20 mm or less in diameter, and 30 mm or more and 100 mm or less in length.

The heating elements 52R in each of the heating element groups 52a to 52c are arranged as being overlapped side by side in the horizontal direction with the longitudinal direction thereof being in the horizontal direction. That is, the heating elements 52R in each of the heating element groups 52a to 52c are arranged with the longitudinal direction oriented perpendicular to the direction in which the exhaust gas flows into the gas inlet port 55I as being overlapped in a direction perpendicular to the direction. The arrangement positions of the heating elements 52R of the heating element group 52a, the arrangement positions of the heating elements 52R of the heating element group 52b, and the arrangement positions of the heating elements 52R of the heating element group 52c are horizontally shifted from each other. In the present embodiment, in each of the heating element groups 52a to 52c, the distance between the heating elements 52R is equal to or less than the diameter of the heating elements 52R. Therefore, when viewed along the direction in which the exhaust gas flows in the gas inlet port 55I, the space between the heating elements 52R of the heating element group 52a is filled with the heating element 52R of at least one of the heating element group 52b and the heating element group 52c. Accordingly, the projection surface of the sub-heater 52 projected toward the direction in which the exhaust gas flows in the gas inlet port 55I covers the gas inlet port 55I.

5.2 Effect

Similarly to the tin trap device 50 of the first embodiment, since the tin trap device 50 of the present embodiment includes the sub-heater 52 arranged downstream of the main heater 51 in the flow of the exhaust gas, tin without adhering to the main heater 51 can adhere to the sub-heater 52. Therefore, as compared with the case where the sub-heater 52 is not provided, more tin can be captured. In addition, the sub-heater 52 is arranged such that a part thereof overlaps the main heater 51 and another part thereof does not overlap the main heater 51 in the direction in which the exhaust gas flows into the gas inlet port 55I. Therefore, even when some part of tin passing by the side of the main heater 51 proceeds around behind the main heater 51, the tin can be captured by a part of the sub-heater 52. Further, even when some other part of the tin passing by the side of the main heater 51 proceeds in a region not overlapping the main heater 51, the tin can be captured by another part of the sub-heater 52.

Further, similarly to the first embodiment, since the surface area of the sub-heater 52 is larger than the surface area of the main heater 51, more tin passing by the side of the main heater 51 can be captured as compared with the case where the surface area of the sub-heater 52 is smaller than the surface area of the main heater 51.

Further, similarly to the first embodiment, the projection surface of the sub-heater 52 projected toward the direction in which the exhaust gas flows in the gas inlet port 55I covers the gas inlet port 55I. Accordingly, the sub-heater 52 can suppress fine particles of tin from coming out of the gas inlet port even when fine particles of tin are scattered by the burst of the bubbles of hydrogen stored in the drain tank 54. Here, the number of the heating element groups may be two. In this case, when viewed along the direction in which the exhaust gas flows in the gas inlet port 55I, the space between the heating elements 52R of the heating element group 52a may be filled with the heating element 52R of the heating element group 52b. Further, the number of the heating element groups may be four or more.

Further, in the present embodiment, when viewed along the direction in which the exhaust gas flows in the gas inlet port 55I, the space between the heating elements 52R of the heating element group 52a is filled with the heating element 52R of at least one of the heating element group 52b and the heating element group 52c. Therefore, tin passing between the heating elements 52R of the heating element group 52a easily come in contact with the heating element 52R of at least one of the heating element group 52b and the heating element group 52c. Therefore, tin is easily captured by the sub-heater 52.

6. Description of Tin Trap Device of Third Embodiment

Next, the tin trap device of a third embodiment will be described. Any component same as that described above is denoted by an identical reference sign, and duplicate description thereof is omitted unless specific description is needed.

6.1 Configuration

Figure 7:
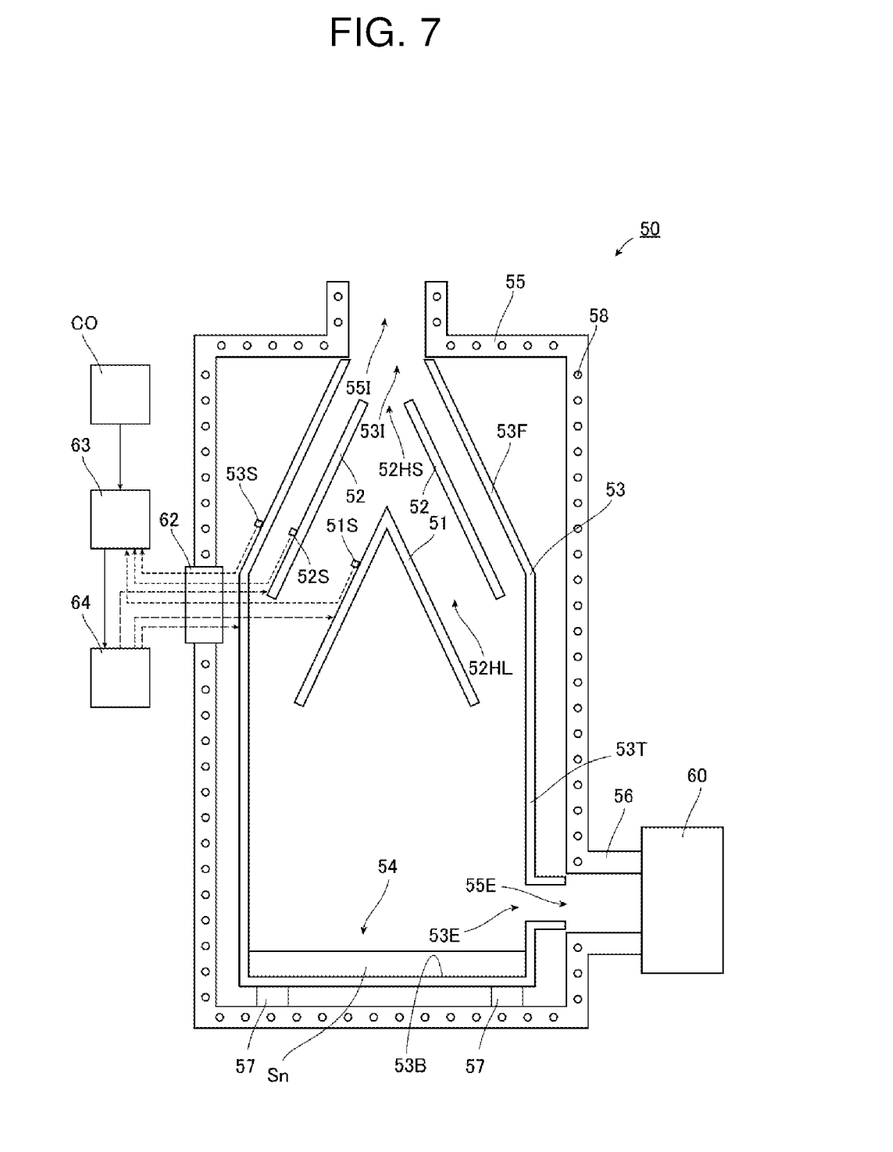
FIG. 7 is a view showing a schematic configuration of the tin trap device according to a third embodiment.

FIG. 7 is a view showing the tin trap device according to the present embodiment. As shown in FIG. 7, in the tin trap device 50 of the present embodiment, the sub-heater 52 is arranged to overlap the main heater 51 upstream of the main heater 51 in the flow of the exhaust gas. The sub-heater 52 of the present embodiment has a truncated cone shape with both bottom surfaces opened. The sub-heater 52 is arranged in a state in which the smaller opening 52HS faces the gas inlet port 55I, and a part of the main heater 51 enters the region surrounded by the sub-heater 52 from the larger opening 52HL of the sub-heater 52. Therefore, at least some of the sub-heater 52 is arranged at a position aligned with the main heater 51 in the direction in which the exhaust gas flows into the gas inlet port 55I.

6.2 Operation

When the residual gas in the chamber device 10 flows into the housing 55 of the tin trap device 50 as the exhaust gas, at least some of the tin contained in the exhaust gas comes in contact with the sub-heater 52. Therefore, tin adheres to the sub-heater 52 in a liquid state. At least some of the tin contained in the exhaust gas entering the region surrounded by the sub-heater 52 from the opening 52HS of the sub-heater 52 adheres to the main heater 51 in a liquid state. At least some of the tin without adhering to the sub-heater 52 and the main heater 51 adheres to the surrounding heater 53 in a liquid state. Similarly to the first embodiment, tin adhering to the main heater 51, the sub-heater 52, and the surrounding heater 53 falls downward by gravity and accumulates in the drain tank 54.

6.3 Effect

The tin trap device 50 of the present embodiment includes a sub-heater 52 having a truncated cone shape with both bottom surfaces opened. Therefore, the configuration can be simplified as compared with the sub-heaters 52 of the first and second embodiments.

7. Description of Tin Trap Device of Fourth Embodiment

Next, the tin trap device of a fourth embodiment will be described. Any component same as that described above is denoted by an identical reference sign, and duplicate description thereof is omitted unless specific description is needed.

7.1 Configuration

Figure 8:
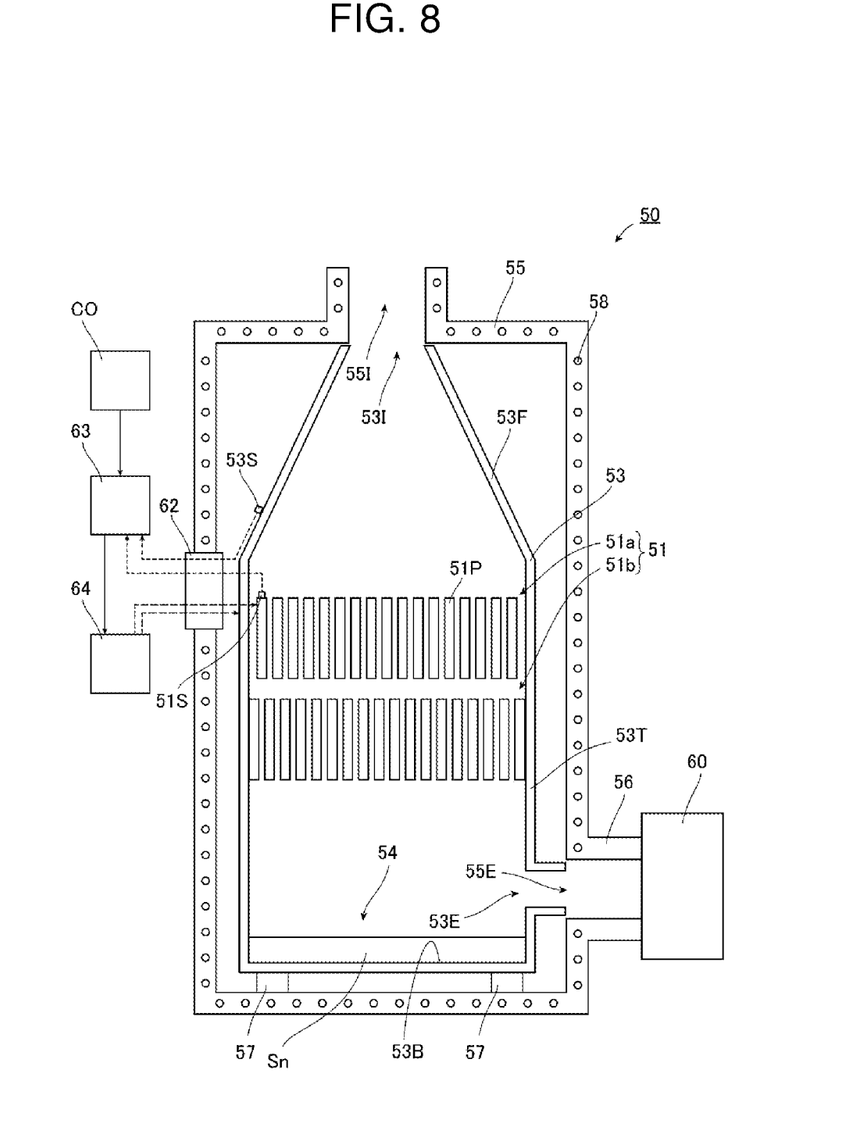
FIG. 8 is a view showing a schematic configuration of the tin trap device according to a fourth embodiment.

FIG. 8 is a view showing the tin trap device according to the present embodiment. As shown in FIG. 8, in the tin trap device 50 of the present embodiment, the configuration of the main heater 51 is similar to that of the sub-heater 52 of the first embodiment, and the sub-heater 52 is not provided.

Here, the heating element groups 52*a* and 52*b* in the first embodiment correspond to the heating element groups 51*a* and 51*b* in the present embodiment, and the heating elements 52P in the first embodiment correspond to the heating elements 51P in the present embodiment. Accordingly, when viewed along the direction in which the exhaust gas flows in the gas inlet port 55I, the space between the heating elements 51P of the heating element group 51*a* may be filled with the heating element 51P of the heating element group 51*b*. Therefore, the projection surface of the main heater 51 projected toward the direction in which the exhaust gas flows in the gas inlet port 55I covers the gas inlet port 55I.

7.2 Effect

In the present embodiment, when viewed along the direction in which the exhaust gas flows in the gas inlet port 55I, the space between the heating elements 51P of the heating element group 51*a* of the main heater 51 is filled with the heating element 51P of the heating element group 51*b*. Therefore, tin passing between the heating elements 51P of the heating element group 51*a* easily come in contact with the heating element 51P of the heating element group 51*b*. Therefore, tin is easily captured by the main heater 51.

In the present embodiment, the number of the heating element groups may be one. In this case, for example, the main surface of the heating elements 51P may be arranged obliquely with respect to the direction in which the exhaust gas at the gas inlet port 55I flows, such that the projection surface of the main heater 51 may cover the gas inlet port 55I. Further, the number of the heating element groups may be three or more.

Here, in the present embodiment, the configuration of the main heater 51 may be similar to that of the sub-heater 52 of the second embodiment.

Although the present invention has been described above with reference to the embodiments, the present invention is not limited to the above embodiments.

For example, in the above embodiments, the tin trap device 50 may not include at least one of the sub-heater 52 and the surrounding heater 53. However, in order to remove more tin from the exhaust gas, it is preferable to provide the sub-heater 52 and the surrounding heater 53.

Further, the drain tank 54 may not be formed as a part of the surrounding heater 53. In this case, the drain tank may not be heated. However, in order to suppress tin in the drain tank from growing in a columnar shape, it is preferable that the drain tank is heated to a temperature equal to or higher than the melting point of tin and lower than the boiling point thereof even when the drain tank is not formed as a part of the surrounding heater 53.

Further, the surrounding heater 53 may be in contact with the inner wall of the housing 55. However, from the viewpoint of suppressing the heating of the housing 55, it is preferable that the surrounding heater 53 is not in contact with the inner wall of the housing 55.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A tin trap device for collecting tin in a chamber device which causes tin to be turned into plasma with laser light in an internal space thereof, comprising:
    a housing provided with a gas inlet port through which exhaust gas in the chamber device flows and a gas exhaust port through which the exhaust gas is exhausted; and
    a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

2. The tin trap device according to claim 1,
    wherein the main heater has a conical shape with a bottom surface thereof opened, and
    the main heater is arranged with an apex thereof oriented toward the gas inlet port.

3. The tin trap device according to claim 1, further comprising:
    a sub-heater arranged in the housing, and configured to have a temperature equal to or higher than the melting point of tin and lower than the boiling point thereof, at least a part of the sub-heater being arranged at a position aligned with the main heater in the direction in which the exhaust gas flows in the gas inlet port.

4. The tin trap device according to claim 3,
    wherein the sub-heater includes a heating element group including a plurality of heating elements, and
    the plurality of heating elements of the heating element group are arranged as being overlapped side by side in a direction perpendicular to the direction in which the exhaust gas flows in the gas inlet port.

5. The tin trap device according to claim 4,
    wherein the sub-heater is arranged downstream of the main heater in flow of the exhaust gas.

6. The tin trap device according to claim 4,
    wherein surface area of the sub-heater is larger than surface area of the main heater.

7. The tin trap device according to claim 4,
wherein a projection surface of the sub-heater projected toward the direction in which the exhaust gas flows in the gas inlet port covers the gas inlet port.

8. The tin trap device according to claim 7,
wherein the sub-heater includes a plurality of the heating element groups aligned in the direction in which the exhaust gas flows in the gas inlet port, and
when viewed along the direction in which the exhaust gas flows in the gas inlet port, a space between the heating elements of one of the heating element groups is filled with the heating element of another of the heating element groups.

9. The tin trap device according to claim 4,
wherein the heating elements are plate-shaped.

10. The tin trap device according to claim 9,
wherein the heating elements are each arranged with an in-plane direction of a main surface thereof oriented along the direction in which the exhaust gas flows in the gas inlet port.

11. The tin trap device according to claim 4,
wherein the heating elements are rod-shaped.

12. The tin trap device according to claim 11,
wherein the heating elements are each arranged with a longitudinal direction thereof being perpendicular to the direction in which the exhaust gas flows in the gas inlet port.

13. The tin trap device according to claim 3,
wherein the sub-heater has a truncated cone shape with both bottom surfaces opened, and
the sub-heater is arranged upstream of the main heater in flow of the exhaust gas with one of the openings oriented toward the gas inlet port.

14. The tin trap device according to claim 13,
wherein the sub-heater is arranged with the opening having smaller area oriented toward the gas inlet port.

15. The tin trap device according to claim 1,
wherein the main heater includes a heating element group including a plurality of heating elements,
the plurality of heating elements of the heating element group are arranged as being overlapped side by side in a direction perpendicular to the direction in which the exhaust gas flows in the gas inlet port, and
projection surfaces of the plurality of heating elements projected toward the direction in which the exhaust gas flows in the gas inlet port covers the gas inlet port.

16. The tin trap device according to claim 15,
wherein the main heater includes a plurality of the heating element groups aligned in the direction in which the exhaust gas flows in the gas inlet port, and
when viewed along the direction in which the exhaust gas flows in the gas inlet port, a space between the heating elements of predetermined one of the heating element groups is filled with the heating element of another of the heating element groups.

17. The tin trap device according to claim 1, further comprising:
a surrounding heater surrounding the main heater in the direction in which the exhaust gas flows in the gas inlet port as being spaced apart from the main heater, and configured to have a temperature equal to or higher than the melting point of tin and lower than the boiling point thereof.

18. The tin trap device according to claim 17, further comprising a drain tank arranged below the main heater and configured to accumulate tin,
wherein the drain tank is formed as a part of the surrounding heater.

19. An extreme ultraviolet light generation apparatus, comprising:
a chamber device configured to cause tin to be turned into plasma with laser light in an internal space thereof; and
a tin trap device configured to collect tin in the chamber device,
the tin trap device including:
a housing provided with a gas inlet port through which exhaust gas in the chamber device flows and a gas exhaust port through which the exhaust gas is exhausted; and
a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

20. An electronic device manufacturing method, comprising:
generating extreme ultraviolet light using an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a chamber device configured to cause tin to be turned into plasma with laser light in an internal space thereof; and
a tin trap device configured to collect tin in the chamber device,
the tin trap device including:
a housing provided with a gas inlet port through which exhaust gas in the chamber device flows and a gas exhaust port through which the exhaust gas is exhausted; and
a main heater arranged in the housing, configured to have a temperature equal to or higher than the melting point of tin and lower than the boiling point thereof, and having a projection surface projected toward a direction in which the exhaust gas flows in the gas inlet port cover the gas inlet port.

* * * * *